United States Patent
Park (10) Patent No.: US 7,333,375 B2
(45) Date of Patent: Feb. 19, 2008

(54) REPAIR CONTROL CIRCUIT OF SEMICONDUCTOR MEMORY DEVICE WITH REDUCED SIZE

(75) Inventor: Jin Su Park, Daegu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 69 days.

(21) Appl. No.: 11/296,021

(22) Filed: Dec. 6, 2005

(65) Prior Publication Data
US 2006/0221730 A1    Oct. 5, 2006

(30) Foreign Application Priority Data
Mar. 31, 2005   (KR) ................. 10-2005-0027299

(51) Int. Cl.
*G11C 29/00* (2006.01)
*G11C 7/00* (2006.01)

(52) U.S. Cl. ............................ 365/200; 365/201

(58) Field of Classification Search ................ 365/200, 365/201, 185.09
See application file for complete search history.

(56) References Cited
U.S. PATENT DOCUMENTS

| | | | |
|---|---|---|---|
| 6,128,241 A | 10/2000 | Choi | |
| 6,229,742 B1 * | 5/2001 | Srinivasan et al. | 365/200 |
| 6,324,106 B2 * | 11/2001 | Urakawa | 365/200 |
| 6,388,929 B1 * | 5/2002 | Shimano et al. | 365/201 |
| 6,434,063 B1 | 8/2002 | Nishio et al. | |
| 6,704,228 B2 | 3/2004 | Jang et al. | |
| 7,116,590 B2 * | 10/2006 | Blodgett | 365/200 |

FOREIGN PATENT DOCUMENTS

| | | | |
|---|---|---|---|
| KR | 1993-0017041 A | 8/1993 |
| KR | 1998-082671 A | 12/1998 |
| KR | 1020000062814 A | 10/2000 |
| KR | 1020030011577 A | 2/2003 |
| KR | 1020030058256 A | 7/2003 |
| TW | 00512356 B | 1/2002 |
| TW | 00540063 B | 7/2003 |
| TW | 200403684 A | 3/2004 |
| TW | 00594775 B | 6/2004 |

* cited by examiner

*Primary Examiner*—Anh Phung
(74) *Attorney, Agent, or Firm*—Townsend and Townsend and Crew LLP

(57) ABSTRACT

A semiconductor device includes a repair control circuit. Addresses of fail cells to be repaired are programmed into a flash cell box, and the fail cells are repaired using the flash cell box, without using a fuse box. An area occupied by a repair control circuit and an overall chip size can be reduced.

16 Claims, 5 Drawing Sheets

REPAIR CONTROL CIRCUIT OF SEMICONDUCTOR MEMORY DEVICE WITH REDUCED SIZE

BACKGROUND

The present invention relates to semiconductor memory devices, and more particularly, to a repair control circuit of a semiconductor memory device.

In general, a semiconductor memory device is designed to include a redundancy memory cell array in order to repair fail cells generated during a manufacturing process. Therefore, a row line or column line of a main memory cell array having one or more fail cells can be substituted by the redundancy memory cells.

Figure 1:
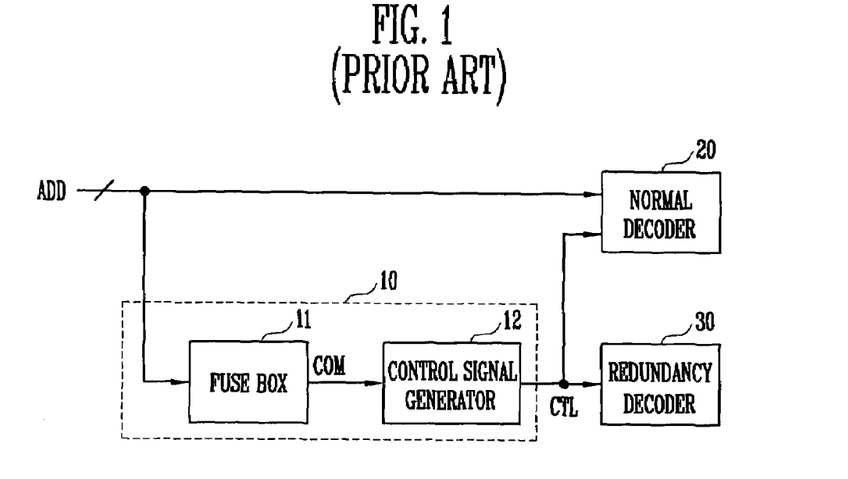
FIG. 1 is a schematic block diagram of a repair control circuit, a normal decoder and a redundancy decoder of a semiconductor memory device in the related art.

FIG. 1 is a schematic block diagram of a repair control circuit, a normal decoder and a redundancy decoder of a semiconductor memory device in the related art. Referring to FIG. 1, the repair control circuit 10 includes a fuse box 11 and a control signal generator 12.

An address of a fail cell to be repaired is previously programmed into the fuse box 11. The fuse box 11 compares a received address (ADD) and its programmed address and outputs a compare signal (COM) according to the comparison result.

The control signal generator 12 outputs a control signal (CTL) for selectively enabling one of the normal decoder 20 and the redundancy decoder 30 in response to the compare signal (COM). As described above, the repair control circuit 10 employs the fuse box 11, which is a circuit that programs an address of a fail cell. In this case, as fuses (not shown) included in the fuse box 11 are selectively cut by a laser, an address of a fail cell is programmed into the fuse box 11. In order for the fuses to be easily cut by a laser, however, the fuses must be designed to have a relatively large size. An occupation area of the fuse box 11 serves as a limiting factor in increasing the level of integration of semiconductor memory devices and reducing the chip size.

Furthermore, these problems become more profound when the number of fail cells to be repaired is increased. That is, the greater the number of redundancy memory cells, the greater the number of fuses included in the fuse box 11. Therefore, a problem arises because the occupation area is increased.

SUMMARY OF THE INVENTION

Embodiments of the present invention provide a repair control circuit of a semiconductor memory device in which addresses of fail cells to be repaired are programmed into a flash cell box without using a fuse box and fail cells are repaired using the flash cell box, reducing an occupation area and an overall chip size.

A repair control circuit according to an embodiment of the present invention includes a flash cell decoder configured to generate a program control signal or a read control signal and word line bias voltages in response to a cell program signal and address signals corresponding to fail cells or in response to a cell read signal and input address signals; a flash cell box configured to execute a program operation or a read operation in response to the program control signal or the read control signal and the word line bias voltages, wherein in the program operation, address signals corresponding to the fail cells are programmed and in the read operation, redundancy control signals are output; and a control signal generator configured to output a decoder select signal in response to the redundancy control signals.

DETAILED DESCRIPTION OF EMBODIMENTS

The present invention will now be described in connection with embodiments with reference to the accompanying drawings.

Figure 2:
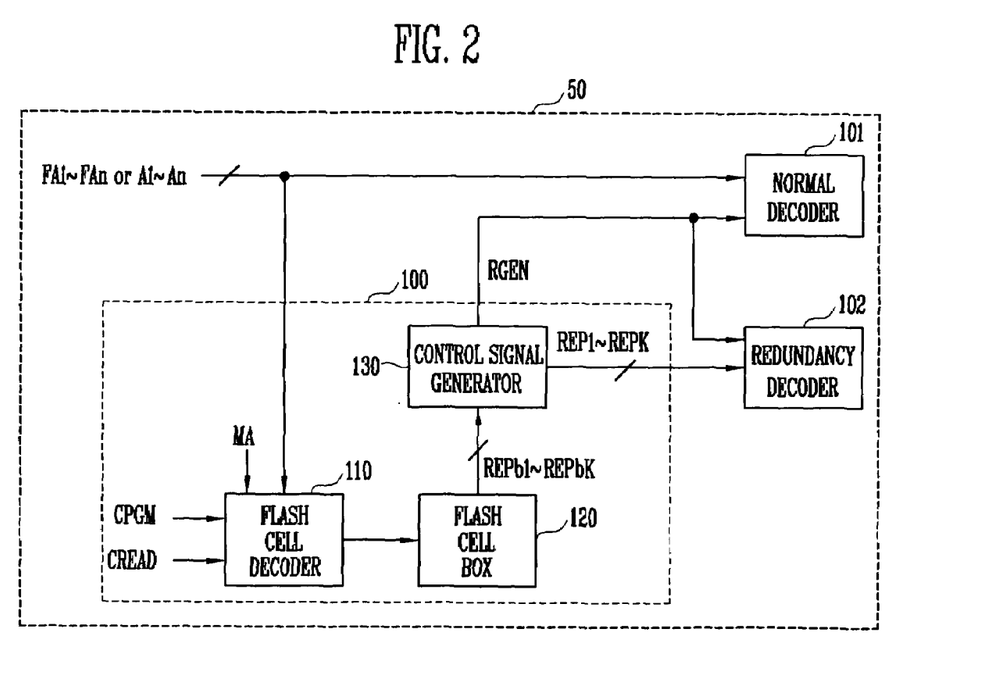
FIG. 2 is a schematic block diagram of a repair control circuit, a normal decoder and a redundancy decoder of a semiconductor memory device according to an embodiment of the present invention.

FIG. 2 is a schematic block diagram a semiconductor memory device 50 including a repair control circuit 100, a normal decoder 101 and a redundancy decoder 102 according to an embodiment of the present invention.

Referring to FIG. 2, the repair control circuit 100 includes a flash cell decoder 110, a flash cell box 120 and a control signal generator 130.

The flash cell decoder 110 controls a program operation, read operation, and erase operation of the flash cell box 120 in response to a cell program signal (CPGM) and address signals (FA1 to FAn) (n is a positive integer) corresponding to fail cells or a cell read signal (CREAD) and input address signals (A1 to An) (n is a positive integer). During the program operation, the address signals (FA1 to FAn) corresponding to fail cells are programmed into the flash cell box 120. Furthermore, during the read operation, the flash cell box 120 outputs redundancy control signals (REPb1 to REPbK) (K is a positive integer) according to a programmed state. The control signal generator 130 outputs a decoder select signal (RGEN) and inverted redundancy control signals (REP1 to REPK) in response to the redundancy control signals (REPb1 to REPbK).

More particularly, the control signal generator 130 enables or disables decoder select signal (RGEN) according to input address signals (A1 to An), which are input to the flash cell decoder 110, and address signals (FA1 to FAn) of fail cells, which are programmed into the flash cell box 120, in response to the redundancy control signals (REPb1 to REPbK). For example, if the input address signals (A1 to An) and the addresses (FA1 to FAn) of the fail cells are identical to each other, the control signal generator 130 enables the decoder select signal (RGEN). If the input address signals (A1 to An) and the addresses (FA1 to FAn) of the fail cells are not identical to each other, the control signal generator 130 disables the decoder select signal (RGEN). Furthermore, the flash cell decoder 110 receives a masking address signal (MA) when the cell program signal (CPGM) is received and enables or disables the flash cell box 120 in response to the masking address signal (MA).

Furthermore, the control signal generator 130 outputs the decoder select signal (RGEN) to the normal decoder 101 and the redundancy decoder 102 and outputs inverted redundancy control signals (REP1 to REPK) to the redundancy decoder 102. As a result, at least one of normal decoder 101 or redundancy decoder 102 is enabled in response to the decoder select signal (RGEN). When the decoder select signal (RGEN) is enabled, the redundancy decoder 102 is enabled and the normal decoder 101 is disabled. On the other hand, when the decoder select signal (RGEN) is disabled, the normal decoder 101 is enabled and the redundancy decoder 102 is disabled.

The normal decoder 101 controls the program operation or the read operation of normal memory cells (not shown) and the redundancy decoder 102 controls the program operation or the read operation of redundancy memory cells (not shown). In addition, the normal decoder 101 and the redundancy decoder 102 can be a row decoder or a column decoder. Furthermore, when the redundancy decoder 102 is enabled, the normal decoder 101 selects some or all of the redundancy memory cells in response to the inverted redundancy control signals (REP1 to REPK) and controls the program operation or the read operation of the selected redundancy memory cells.

Figure 3:
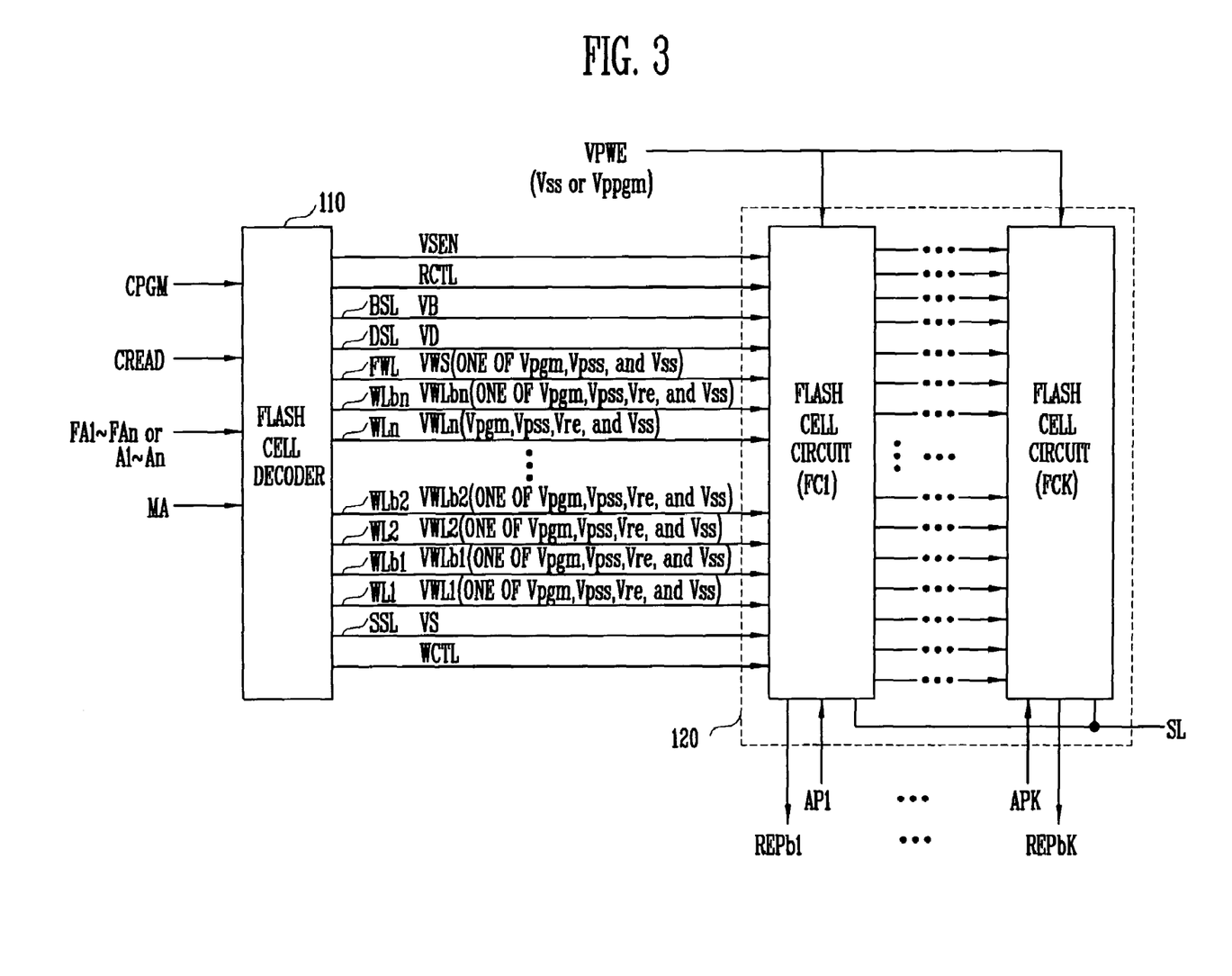
FIG. 3 is a detailed block diagram of a flash cell decoder and a flash cell box shown in FIG. 2.

FIG. 3 is a detailed block diagram of the flash cell decoder and the flash cell box shown in FIG. 2.

Referring to FIG. 3, the flash cell decoder 110 outputs a read control signal (RCTL) in response to the cell read signal (CREAD) and outputs a write control signal (WCTL) in response to the cell program signal (CPGM). Furthermore, the flash cell decoder 110 generates a switching control voltage (VB), a drain select line voltage (VD), a source select line voltage (VS) and a sensing control voltage (VSEN) in response to one of the cell program signal (CPGM) and the cell read signal (CREAD). More particularly, the flash cell decoder 110 outputs the switching control voltage (VB) to a switching control line BSL, the drain select line voltage (VD) to a drain select line DSL and the source select line voltage (VS) to a source select line SSL.

The flash cell decoder 110 outputs a first word line bias voltage (VWS) to a control word line FWL in response to the cell program signal (CPGM) and the masking address signal (MA) or the cell read signal (CREAD). More particularly, the flash cell decoder 110 outputs one of a program voltage (Vpgm) (e.g., 18V) and a pass voltage (Vpss) (e.g., 10V) as the first word line bias voltage (VWS) in response to the cell program signal (CPGM) and the masking address signal (MA). The flash cell decoder 110 can output the program voltage (Vpgm) as the first word line bias voltage (VWS) when the masking address signal (MA) is logic "1" and outputs the pass voltage (Vpss) as the first word line bias voltage (VWS) when the masking address signal (MA) is logic "0".

Alternately, the flash cell decoder 110 can output the program voltage (Vpgm) as the first word line bias voltage (VWS) when the masking address signal (MA) is logic "0" and can output the pass voltage (Vpss) as the first word line bias voltage (VWS) when the masking address signal (MA) is logic "1". Furthermore, the flash cell decoder 110 outputs an erase voltage (i.e., a ground voltage (Vss)) (e.g., 0V) as the first word line bias voltage (VWS) initially (i.e., before the program voltage (Vpgm) is output) in response to the cell program signal (CPGM). In addition, the flash cell decoder 110 outputs the ground voltage (Vss) as the first word line bias voltage (VWS) in response to the cell read signal (CREAD).

Furthermore, the flash cell decoder 110 outputs second word line bias voltages (VWL1 to VWLn) (n is an integer) to first word lines WL1 to WLn (n is an integer), respectively, in response to the cell program signal (CPGM), the address signals (FA1 to FAn) corresponding to fail cells or the cell read signal (CREAD) and the input address signals (A1 to An), and outputs third word line bias voltages (VWLb1 to VWLbn) (n is a positive integer) to second word lines WLb1 to WLbn (n is a positive integer), respectively. More particularly, the flash cell decoder 110 outputs the second word line bias voltages (VWL1 to VWLn) and the third word line bias voltages (VWLb1 to VWLbn) as the program voltage (Vpgm) or the pass voltage (Vpss) in response to the cell program signal (CPGM) and the address signals (FA1 to FAn) corresponding to fail cells.

For example, when the address signals (FA1 to FAn) is logic "1", the flash cell decoder 110 outputs the second word line bias voltages (VWL1 to VWLn) as the program voltage (Vpgm) level and the third word line bias voltages (VWLb1 to VWLbn) as the pass voltage (Vpss) level. On the other hand, when the address signals (FA1 to FAn) is logic "0", the flash cell decoder 110 outputs the second word line bias voltages (VWL1 to VWLn) as the pass voltage (Vpss) level and the third word line bias voltages (VWLb1 to VWLbn) as the program voltage (Vpgm) level. For example, when a logic value of the address signals (FA1 to FA5) is "11010", the flash cell decoder 110 outputs the second word line bias voltages (VWL1, VWL2, VWL4) and the third word line bias voltages (VWLb3, VWLb5) as the program voltage (Vpgm) level and the second word line bias voltages (VWL3, VWL5) and the third word line bias voltages (VWLb1, VWLb2, VWLb4) as the pass voltage (Vpss) level.

In addition, the flash cell decoder 110 outputs the second word line bias voltages (VWL1 to VWLn) and the third word line bias voltages (VWLb1 to VWLbn) as the read voltage (Vre) or the ground voltage (Vss) in response to the cell read signal (CREAD) and the input address signals (A1 to An). The read voltage (Vre) can be set to be higher than a threshold voltage of one of the programmed memory cells C1 to Cn (see FIG. 4).

When the input address signals (A1 to An) is logic "1", the flash cell decoder 110 outputs the second word line bias voltages (VWL1 to VWLn) as the read voltage (Vre) level and the third word line bias voltages (VWLb1 to VWLbn) as the ground voltage (Vss) level. Furthermore, when the input address signals (A1 to An) are logic "0", the flash cell decoder 110 outputs the second word line bias voltages (VWL1 to VWLn) as the ground voltage (Vss) level and the third word line bias voltages (VWLb1 to VWLbn) as the read voltage (Vre) level.

Meanwhile, for example, when a logic value of the input address signals (A1 to An) is "11010", the flash cell decoder 110 outputs the second word line bias voltages (VWL1, VWL2, VWL4) and the third word line bias voltages (VWLb3, VWLb5) as the read voltage (Vre) level and the second word line bias voltages (VWL3, VWL5) and the third word line bias voltages (VWLb1, VWLb2, VWLb4) as the ground voltage (Vss) level.

The flash cell box 120 includes a group of flash cell circuits FC1 to FCK (K is a positive integer). The group of flash cell circuits FC1 to FCK shares the switching control line BSL, the drain select line DSL, the source select line SSL and the source line SL. Furthermore, the group of flash cell circuits FC1 to FCK shares a first word line FWL, second word lines WL1 to WLn and third word lines WLb1 to WLbn. In addition, a bulk voltage (VPWE) is input to a P-well of the flash cell circuits FC1 to FCK. At the program operation or the read operation of the flash cell circuits FC1 to FCK, the bulk voltage (VPWE) of the ground voltage (Vss) level is input to the flash cell circuits FC1 to FCK.

Furthermore, at the time of the erase operation of the flash cell circuits FC1 to FCK, the bulk voltage (VPWE) of the program voltage (Vppgm) level (e.g., 20V) is input to the flash cell circuits FC1 to FCK. Meanwhile, in the case where the repair control circuit 100 is included in a flash memory device, the P-well of the flash cell circuits FC1 to FCK can be designed in such a way as to be separated from the P-well of the memory cell array of the flash memory device.

During the read operation, the flash cell circuits FC1 to FCK output the redundancy control signals (REPb1 to PEPbK) in response to the sensing control voltage (VSEN), the first to third word line bias voltages (VWS, VWL1 to VWLn and VWLb1 to VWLbn) and the read control signal (RCTL). Furthermore, during the program operation, the flash cell circuits FC1 to FCK execute the program operation in response to the first to third word line bias voltages (VWS, VWL1 to VWLn and VWLb1 to VWLbn), the program control signals (AP1 to APK) (K is an integer) and the write control signal (WCTL). Consequently, the address signals (FA1 to FAn) corresponding to the fail cells are programmed into the flash cell circuits FC1 to FCK.

The flash cell circuits FC1 to FCK will be described below in more detail. The flash cell circuits FC1 to FCK have the same construction and operation. Therefore, only the flash cell circuit FC1 will be described.

Figure 4:
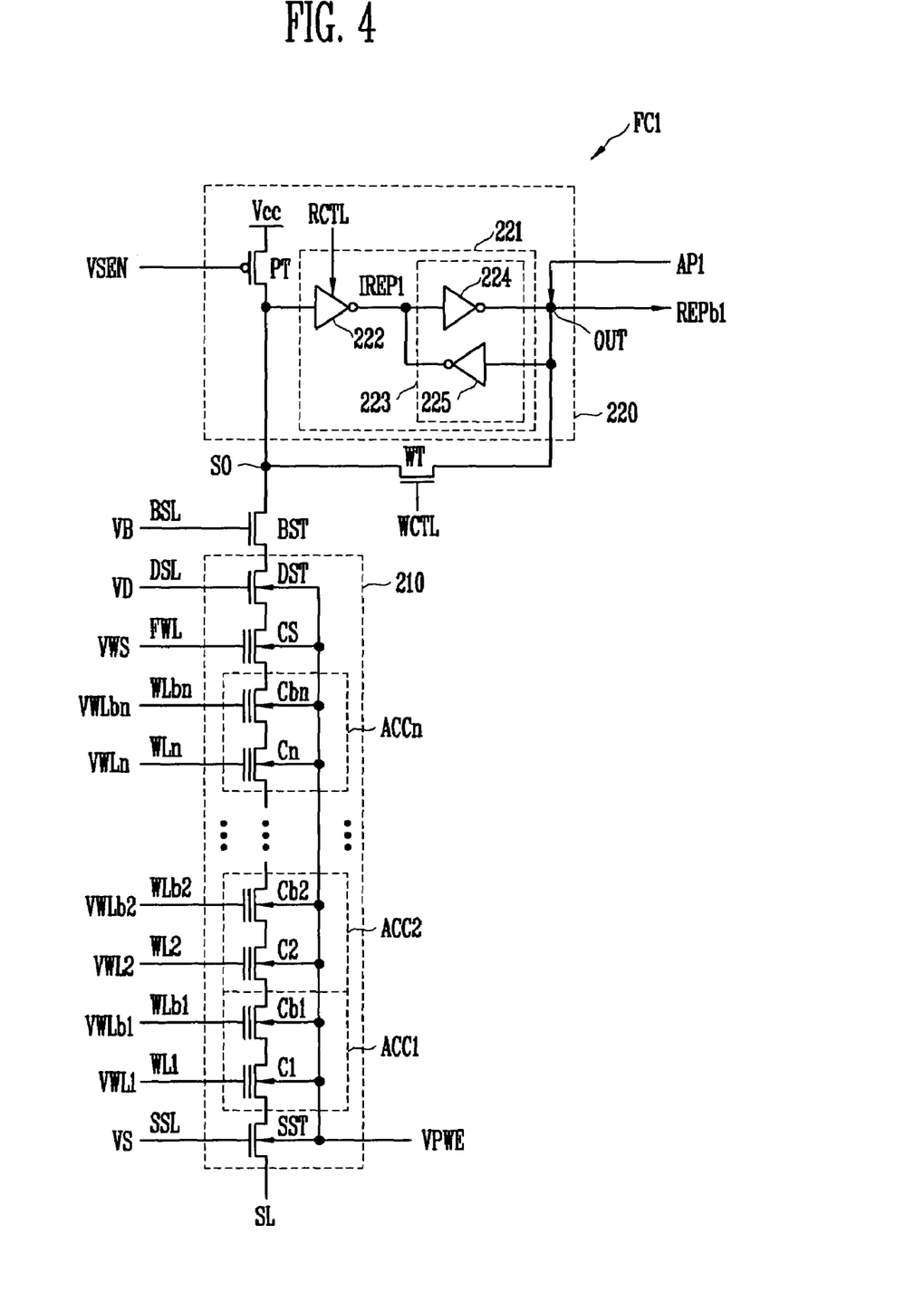
FIG. 4 is a detailed circuit diagram of a flash cell circuit shown in FIG. 3.

FIG. 4 is a detailed circuit diagram of the flash cell circuit FC1 shown in FIG. 3. The flash cell circuit FC1 includes a redundancy cell string 210, a string switch circuit BST, a sensing circuit 220 and a write control circuit WT. The redundancy cell string 210 includes a drain select transistor DST, a source select transistor SST, a control memory cell CS and address cell circuits ACC1 to ACCn (n is a positive integer).

The drain select transistor DST has the gate connected to a drain select line DSL and the source select transistor SST has the gate connected to the source select line SSL. The drain select transistor DST is also connected to a string switch circuit BST and is turned on or off in response to the drain select line voltage (VD) received through the drain select line DSL. The source select transistor SST is also connected to a source line SL and is turned on or off in response to the source select line voltage (VS) received through the source select line SSL. The control memory cell CS has the gate connected to the first word line FWL. The control memory cell CS is programmed or not programmed in response to the first word line bias voltage (VWS) received through the first word line FWL.

For example, when the first word line bias voltage (VWS) is the program voltage (Vpgm) level, the control memory cell CS is programmed. When the first word line bias voltage (VWS) is the pass voltage (Vpss) level, the control memory cell CS is not programmed. In this case, if the control memory cell CS is in a programmed state, the redundancy cell string 210 is disabled. If the control memory cell CS is in an erased state, the redundancy cell string 210 is enabled. Therefore, in the case where the control memory cell CS is erased, the redundancy cell string 210 can be used to repair a fail cell. In the case where the control memory cell CS is programmed, the redundancy cell string 210 cannot be used to repair a fail cell.

Each of the address cell circuits ACC1 to ACCn is connected to a pair of word lines including one of the first word lines WL1 to WLn and one of the second word lines WLb1 to WLbn. More particularly, the address cell circuit ACC1 can be connected to the first word line WL1 and the second word line WLb1. Furthermore, the address cell circuits ACC1 to ACCn can be connected in series between the control memory cell CS and the source select transistor SST.

Each of the address cell circuits ACC1 to ACCn includes one of the first memory cells C1 to Cn and one of the second memory cells Cb1 to Cbn. For example, the address cell circuit ACC1 includes first and second memory cells C1, Cb1. The first memory cells C1 to Cn have the gates respectively connected to the second word lines WL1 to WLn. The second memory cells Cb1 to Cbn have the gates respectively connected to the third word lines WLb1 to WLbn. During the program operation, the address signals (FA1 to FAn) corresponding to fail cells are programmed into the address cell circuits ACC1 to ACCn, respectively. More particularly, one of the first memory cells C1 to Cn or one of the second memory cells Cb1 to Cbn of each of the address cell circuits ACC1 to ACCn is programmed according to a logic value of the address signals (FA1 to FAn). For example, when a logic value of the address signal (FA1) is "1", the first memory cell C1 of the address cell circuit ACC1 can be programmed. When a logic value of the address signal (FA1) is "0", the second memory cell Cb1 of the address cell circuit ACC1 can be programmed.

In the read operation, the first and second memory cells C1, Cb1 to Cn, Cbn of the address cell circuits ACC1 to ACCn are all turned on, or partially turned on according to a program state of the address cell circuits ACC1 to ACCn and a logic value of the input address signals (A1 to An). For example, when the first memory cells C1 to Cn are all programmed and a logic value of the input address signals (A1 to An) is all "1", the first and second memory cells C1, Cb1 to Cn, Cbn are all turned on. As described above, if the first and second memory cells C1 to Cn, Cb1 to Cbn of the address cell circuits ACC1 to ACCn are all turned on, the sensing node SO is connected to the source line SL and is discharged as the ground voltage (Vss) supplied to the source line SL. On the other hand, if the first memory cells C1 to Cn are all programmed and a logic value of the input address signals (A1 to An) is all "0", the first memory cells C1 to Cn are all turned off and the second memory cells Cb1 to Cbn are all turned on. As described above, if one or some of the first and second memory cells C1 to Cn, Cb1 to Cbn of the address cell circuits ACC1 to ACCn is turned off, the sensing node SO is separated from the source line SL. Therefore, a voltage of the sensing node SO keeps intact.

The string switch circuit BST can be implemented using a NMOS transistor. The string switch circuit BST can be implemented using a high voltage element. The string switch circuit BST is connected between the sensing node SO and the redundancy cell string 210. The string switch circuit BST connects the redundancy cell string 210 to the sensing node SO or separates the redundancy cell string 210 from the sensing node SO in response to the switching control voltage (VB).

The sensing circuit 220 includes a precharge circuit PT and a latch circuit 221. The precharge circuit PT can be implemented using a PMOS transistor and precharges the sensing node SO with an internal voltage (Vcc) in response to the sensing control voltage (VSEN). The precharge circuit PT can be implemented using a PMOS transistor having a current driving ability smaller than that of the memory cells C1 to Cn, Cb1 to Cbn of the redundancy cell string 210.

The latch circuit 221 includes an inverter 222 and a latch 223. The latch 223 includes inverters 224, 225. The inverter 222 senses a voltage of the sensing node SO in response to the read control signal (RCTL) and outputs a sensing signal (IREP1). The latch 223 latches the sensing signal (IREP1) and outputs the latched signal to an output node OUT as the redundancy control signal (REPb1). The write control circuit WT can be implemented using a NMOS transistor and outputs a program control signal (AP1), which is received from the output node OUT, to the sensing node SO in response to the write control signal (WCTL).

Figure 5:
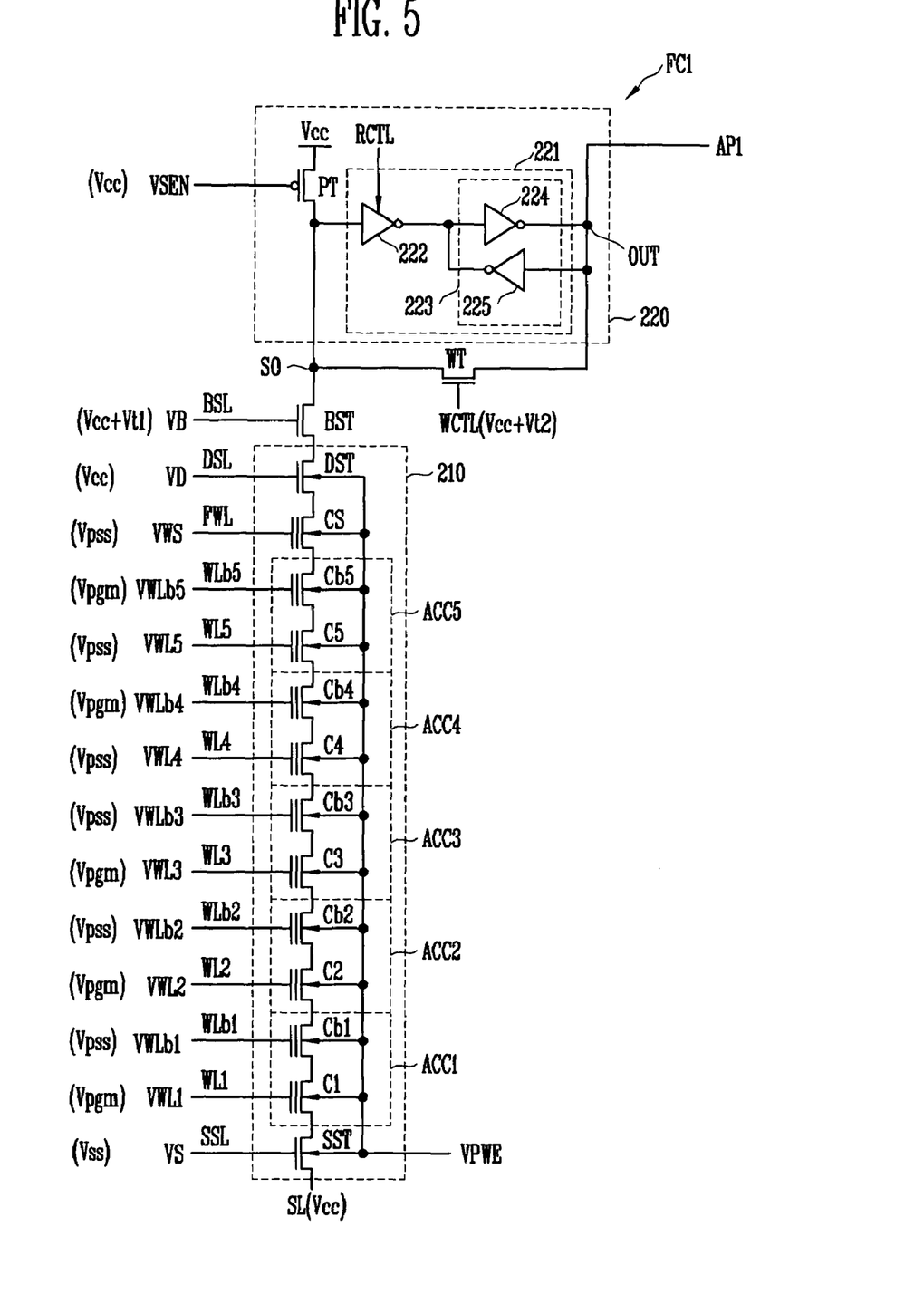
FIG. 5 is a view for illustrating the read operation of the flash cell circuit shown in FIG. 4.

The program operation of the flash cell circuit FC1 will be described below in detail with reference to FIG. 5. To simplify description, it is assumed that the redundancy cell string 210 includes the address cell circuits ACC1 to ACC5.

At the initial stage of the flash cell decoder 110, the erase operation of the control memory cell CS, and the first and second memory cells C1 to Cn, Cb1 to Cbn of the address cell circuits ACC1 to ACC5 are controlled. The erase operation of the control memory cell CS and the first and second memory cells C1 to Cn, Cb1 to Cbn can be evident to those skilled in the art. Description thereof will be omitted.

The flash cell decoder 110 then outputs the sensing control voltage (VSEN) as the internal voltage (Vcc) level and outputs the switching control voltage (VB) as the voltage (Vcc+Vt1, where Vt1 is a threshold voltage of the NMOS transistor BST, i.e., a string switch circuit) level, in response to the cell program signal (CPGM). As a result, the precharge circuit PT of the sensing circuit 220 is turned off and the NMOS transistor BST is turned on. Furthermore, the flash cell decoder 110 outputs the drain select line voltage (VD) as the internal voltage (Vcc) level and the source select line voltage (Vss) as the ground voltage (Vss) level in response to the cell program signal (CPGM). Consequently, the drain select transistor DST is turned on and the source select transistor SST is turned off.

The flash cell decoder 110 generates the write control signal (WCTL) in response to the cell program signal (CPGM). The flash cell decoder 110 outputs the write control signal (WCTL) as a voltage (Vcc+Vt2, where Vt2 is a threshold voltage of the NMOS transistor WT, i.e., a write control circuit) level. As a result, the NMOS transistor WT is turned on and outputs the program control signal (AP1), which is received from the output node OUT, to the sensing node SO. When the program control signal (AP1) is logic "1" (i.e., the internal voltage (Vcc) level), the internal voltage (Vcc) is applied to the sensing node SO. Therefore, the address cell circuits ACC1 to ACC5 do not perform the program operation. Meanwhile, when the program control signal (AP1) is logic "0" (i.e., the ground voltage (Vss) level), the ground voltage (Vss) is applied to the sensing node SO. Therefore, the address cell circuits ACC1 to ACC5 perform the program operation.

For example, when a logic value of the address signals (FA1 to FA5) corresponding to fail cells, which are received, is "11100", the flash cell decoder 110 outputs the second word line bias voltages (VWL1 to VWL3) and the third word line bias voltages (VWLb4, VWLb5) as the program voltage (Vpgm) and the second word line bias voltages (VWL4, VWL5) and the third word line bias voltages (VWLb1 to VWLb3) as the pass voltage (Vpss). Consequently, the first memory cells C1 to C3 and the second memory cells Cb4, Cb5 are programmed and the first memory cells C4, C5 and the second memory cells Cb1 to Cb3 are not programmed but stay erased.

Figure 6:
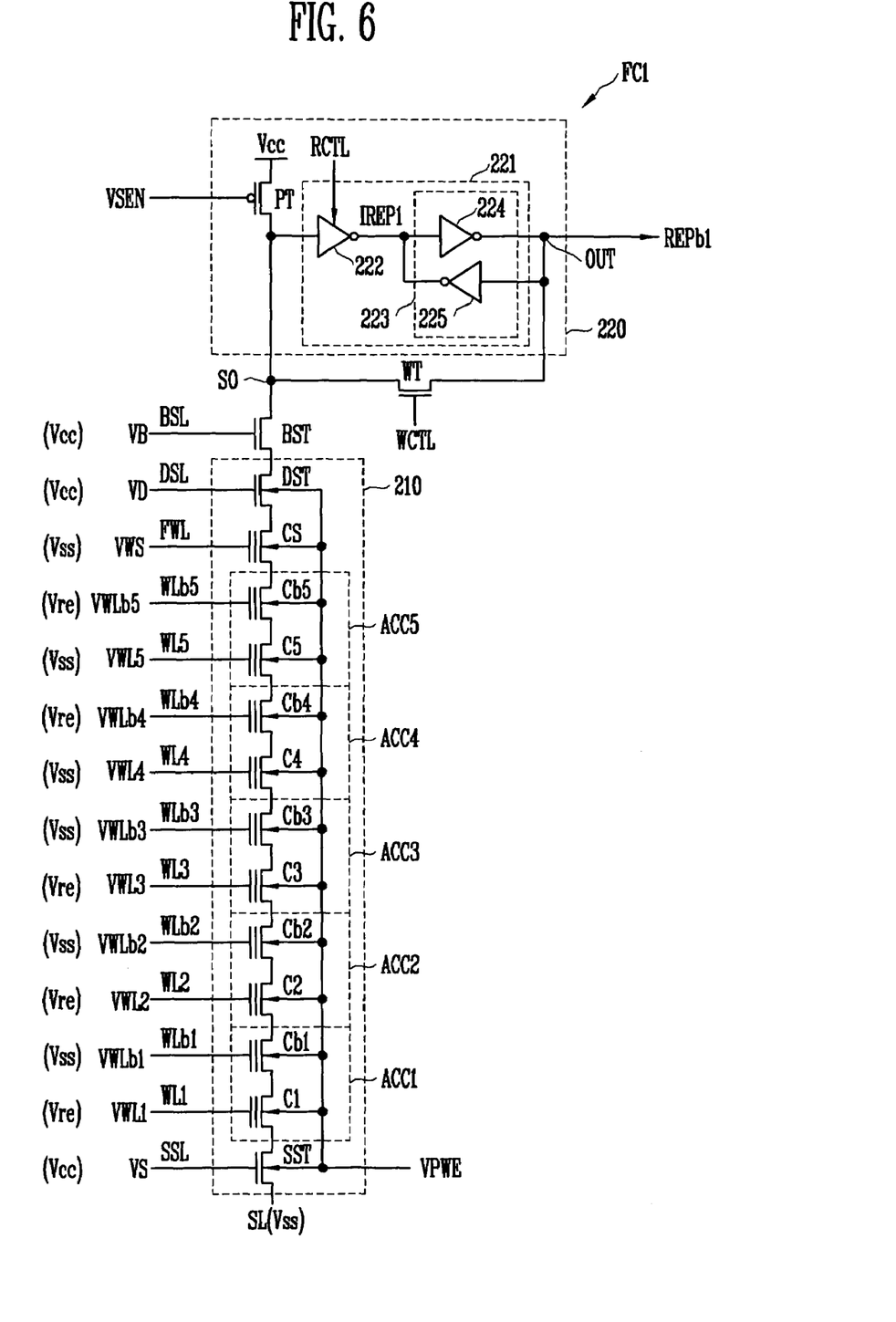
FIG. 6 is a view for illustrating the program operation of the flash cell circuit shown in FIG. 4.

The read operation of the flash cell circuit FC1 will be described below with reference to FIG. 6. To simplify description, it is assumed that the redundancy cell string 210 includes the address cell circuits ACC1 to ACC5. Furthermore, in the case where the first memory cells C1 to C3 and the second memory cells Cb4, Cb5 are programmed, the read operation of the flash cell circuit FC1 will be described.

The flash cell decoder 110 outputs the sensing control voltage (VSEN) as the ground voltage (Vss) during a predetermined time in response to the cell read signal (CREAD). As a result, the precharge circuit PT of the sensing circuit 220 precharges the sensing node SO with the internal voltage (Vcc) for the predetermined time. Furthermore, the flash cell decoder 110 outputs the drain select line voltage (VD) and the source select line voltage (Vss) as the internal voltage (Vcc) level in response to the cell read signal (CREAD). As a result, the drain select transistor DST and the source select transistor SST are turned on.

For example, when a logic value of the input address signals (A1 to An) is "11100", the flash cell decoder 110 outputs the second word line bias voltages (VWL1 to VWL3) and the third word line bias voltages (VWLb4, VWLb5) as the read voltage (Vre) and the second word line bias voltages (VWL4, VWL5) and the third word line bias voltages (VWLb1 to VWLb3) as the ground voltage (Vss). As a result, the first and second memory cells C1 to C5, Cb1 to Cb5 are all turned on to connect the sensing node SO to the source line SL. Since the ground voltage (Vss) is supplied to the source line SL, the sensing node SO is discharged as the ground voltage (Vss).

Thereafter, the flash cell decoder 110 enables the read control signal (RCTL) in response to the cell read signal (CREAD). As a result, the inverter 222 of the latch circuit 221 senses a voltage of the sensing node SO and outputs the sensing signal (IREP1) at a logic high level (e.g., 1). The latch 223 latches the sensing signal (IREP1) and outputs the redundancy control signal (REPb1) of a logic low level (e.g., 0) to the output node OUT.

Meanwhile, when a logic value of the input address signals (A1 to An) is "00011", the flash cell decoder 110 outputs the second word line bias voltages (VWL1 to VWL3) and the third word line bias voltages (VWLb4, VWLb5) as the ground voltage (Vss) and the second word line bias voltages (VWL4, VWL5) and the third word line bias voltages (VWLb1 to VWLb3) as the read voltage (Vre). As a result, the first memory cells C1 to C3 and the second memory cells Cb4, Cb5 are turned off and the first memory cells C4, C5 and the second memory cells Cb1 to Cb3 are turned on. Therefore, since the sensing node SO is separated from the source line SL, the sensing node SO is maintained at the internal voltage (Vcc) level.

Thereafter, the flash cell decoder 110 enables the read control signal (RCTL) in response to the cell read signal (CREAD). As a result, the inverter 222 of the latch circuit 221 senses a voltage of the sensing node SO and outputs the sensing signal (IREP1) at a logic low level. The latch 223 latches the sensing signal (IREP1) and outputs the redundancy control signal (REPb1) of a logic high level to the output node OUT.

As described above, according to the present invention, addresses of fail cells to be repaired are programmed into a flash cell box and the fail cells are repaired using the flash cell box, without using a fuse box. An occupation area of a repair control circuit and an overall chip size can be reduced.

Although the foregoing description has been made with reference to the embodiments, it is to be understood that changes and modifications of the present invention may be made by those ordinary skilled in the art without departing from the spirit and scope of the present invention and appended claims.

What is claimed is:

1. A semiconductor memory device comprising:
   a first decoder configured to control at least a program operation of the semiconductor memory device;
   a repair control circuit includes:

a flash cell decoder configured to generate a program control signal or a read control signal and word line bias voltages in response to:
  a cell program signal and address signals corresponding to fail cells, or
  a cell read signal and input address signals;
a flash cell box configured to execute a program operation or a read operation in response to the program control signal or the read control signal and the word line bias voltages, wherein in the program operation, address signals corresponding to the fail cells are programmed, and redundancy control signals are output in the read operation; and
a control signal generator configured to output a decoder select signal in response to the redundancy control signals.

2. The semiconductor memory device as claimed in claim 1, wherein the control signal generator is further configured to:
  compare the input address signals and the address signals corresponding to the fail cells with respect to each other in response to the redundancy control signals, and
  enable or disable the decoder select signal according to a result of the comparison of the input address signals and the address signals corresponding to the fail cells,
  wherein the first decoder is enabled in response to the decoder select signal,
  wherein the semiconductor device is a non-volatile memory device.

3. The semiconductor memory device as claimed in claim 1, wherein the flash cell decoder is further configured to:
  invert the redundancy control signals to generate inverted redundancy control signals, and
  generate a switching control voltage, a drain select line voltage, a source select line voltage and a sensing control voltage in response to the cell program signal or the cell read signal,
  wherein the first decoder is a redundancy decoder and is configured to control driving of redundancy memory cells in response to the inverted redundancy control signals.

4. The semiconductor memory device as claimed in claim 3, further comprising:
  a second decoder that is a normal decoder that controls driving of normal memory cells,
  wherein the flash cell box comprises a plurality of flash cell circuits which share a control word line, a plurality of word line pairs, a drain select line, a source select line and a source line,
  wherein the flash cell box receives the word line bias voltages through the control word line and the plurality of word line pairs, the drain select line voltage through the drain select line and the source select line voltage through the source select line, and receives the switching control voltage and the sensing control voltage, and
  wherein each of the plurality of flash cell circuits applies address signals corresponding to the fail cells in response to one of the program control signals and the write control signal, and outputs one of the redundancy control signals in response to the read control signal.

5. The semiconductor memory device as claimed in claim 4, wherein each of the plurality of flash cell circuits comprises:
  a redundancy cell string, which is connected to the control word line, the plurality of word line pairs, the drain select line, the source select line and the source line,
  wherein each of the plurality of flash cell circuits is configured to:
    store address signals corresponding to the fail cells in response to one of the program control signals received from a sensing node and the word line bias voltages in the program operation, and
    change or maintain a voltage of the sensing node according to the storage stage in the read operation;
  a sensing circuit configured to sense a voltage of the sensing node and output one of the redundancy control signals to an output node according to the sensing result, in response to the read control signal; and
  a write control circuit configured to output one of the program control signals received from the output node to the sensing node in response to the write control signal.

6. The semiconductor memory device as claimed in claim 5, wherein each of the plurality of flash cell circuits further comprises a string switch circuit coupled between the sensing node and the redundancy cell string, further coupling the redundancy cell string to the sensing node or separating the redundancy cell string from the sensing node in response to the switching control voltage.

7. The semiconductor memory device as claimed in claim 5, wherein the word line bias voltages include a first word line bias voltage, second word line bias voltages and third word line bias voltages, and
  the redundancy cell string comprises:
    a drain select transistor that is turned on or off in response to the drain select line voltage received through the drain select line;
    a source select transistor, which is connected to the source line and is turned on or off in response to the source select line voltage received through the source select line;
    a control memory cell, which is connected to the drain select transistor and receives the first word line bias voltage through the control word line; and
    a plurality of address cell circuits, which are connected in series between the control memory cell and the source select transistor, further coupled to the plurality of word line pairs, respectively, receive one of the second word line bias voltages and one of the third word line bias voltages through a pair of word lines which correspond to each other, and store address signals corresponding to the fail cells in the program operation.

8. The semiconductor memory device as claimed in claim 7, wherein the flash cell decoder outputs one of a program voltage, a pass voltage, and an erase voltage as a first word line bias voltage in response to a masking address signal,
  wherein the control memory cell is erased in response to the erase voltage and programmed in response to the program voltage in the program operation, or not programmed in response to the pass voltage,
  wherein when the control memory cell is in a programmed state, the redundancy cell string is disabled, and when the control memory cell is in an erased state, the redundancy cell string is enabled.

9. The semiconductor memory device as claimed in claim 7, wherein each of the plurality of address cell circuits comprises:
  a first memory cell configured to receive one of the second word line bias voltages through one of the pair of word lines; and
  a second memory cell configured to receive one of the third word line bias voltages through the other of the pair of word lines.

10. The semiconductor memory device as claimed in claim 9, wherein in the program operation, the flash cell decoder outputs the second word line bias voltages of a program voltage level and the third word line bias voltages of a pass voltage level when the address signals corresponding to the fail cells are logic "1", and outputs the second word line bias voltages of a pass voltage level and the third word line bias voltages of a program voltage level when the address signals corresponding to the fail cells are logic "0".

11. The semiconductor memory device as claimed in claim 10, wherein one of the second word line bias voltages is the program voltage level, the first memory cell is programmed and when one of the third word line bias voltages is the program voltage level, the second memory cell is programmed, wherein when the first memory cell is programmed, the second memory cell is not programmed.

12. The semiconductor memory device as claimed in claim 9, wherein in the read operation, the flash cell decoder outputs the second word line bias voltages of a read voltage level and the third word line bias voltages of a ground voltage level when the input address signals are logic "1", and outputs the second word line bias voltages of the ground voltage level and the third word line bias voltages of a read voltage level when the input address signals are logic "0", and wherein the read voltage has a threshold voltage higher than that of any one of the first and second memory cells, which is programmed.

13. The semiconductor memory device as claimed in claim 12, wherein when one of the input address signals is logic "1" and the first memory cell is in a programmed state, the first memory cell is turned on in response to one of the second word line bias voltages, and the second memory cell is turned on in response to one of the third word line bias voltages, and when any one of the input address signals is logic "0" and the first memory cell is in a programmed state, the first memory cell is turned off in response to one of the second word line bias voltages and the second memory cell is turned on in response to one of the third word line bias voltages.

14. The semiconductor memory device as claimed in claim 12, wherein when one of the input address signals is logic "1" and the second memory cell is in a programmed state, the first memory cell is turned on in response to one of the second word line bias voltages, and the second memory cell is turned off in response to one of the third word line bias voltages, and when any one of the input address signals is logic "0" and the second memory cell is in a programmed state, the first memory cell is turned on in response to one of the second word line bias voltages and the second memory cell is turned on in response to one of the third word line bias voltages.

15. The semiconductor memory device as claimed in claim 9, wherein in the read operation, when the first and second memory cells of each of the plurality of address cell circuits are all turned on, the sensing node is discharged as a ground voltage, and when one or a part of the first and second memory cells of each of the plurality of address cell circuits is turned off, a voltage of the sensing node remains at the voltage of the sensing node.

16. The semiconductor memory device as claimed in claim 15, wherein the sensing circuit comprises:

a precharge circuit configured to precharge the sensing node with an internal voltage in response to the sensing control voltage; and a latch circuit configured to sense a voltage of the sensing node in response to the read control signal, latch the sensed signal, and output the latched signal to the output node as one of the redundancy control signals.

* * * * *